United States Patent
Jiang et al.

(10) Patent No.: US 9,553,129 B2
(45) Date of Patent: Jan. 24, 2017

(54) MAGNETIC TUNNEL JUNCTION STACK ALIGNMENT SCHEME

(71) Applicant: GLOBALFOUNDRIES Singapore Pte. Ltd., Singapore (SG)

(72) Inventors: Yi Jiang, Singapore (SG); Wanbing Yi, Singapore (SG); Juan Boon Tan, Singapore (SG); Danny Pak-Chum Shum, Singapore (SG)

(73) Assignee: GLOBALFOUNDRIES SINGAPORE PTE. LTD., Singapore (SG)

( * ) Notice: Subject to any disclaimer, the term of this patent is extended or adjusted under 35 U.S.C. 154(b) by 0 days.

(21) Appl. No.: 14/862,173

(22) Filed: Sep. 23, 2015

(65) Prior Publication Data
US 2016/0093670 A1  Mar. 31, 2016

Related U.S. Application Data

(60) Provisional application No. 62/054,995, filed on Sep. 25, 2014.

(51) Int. Cl.
*H01L 43/02* (2006.01)
*H01L 43/12* (2006.01)
*H01L 27/22* (2006.01)
*H01L 43/08* (2006.01)

(52) U.S. Cl.
CPC ............ *H01L 27/222* (2013.01); *H01L 43/02* (2013.01); *H01L 43/08* (2013.01); *H01L 43/12* (2013.01)

(58) Field of Classification Search
CPC ....... H01L 27/222–27/228; H01L 43/12–43/14
See application file for complete search history.

(56) References Cited

U.S. PATENT DOCUMENTS

2006/0017180 A1*  1/2006  Sarma .................. H01L 23/544
257/797

* cited by examiner

*Primary Examiner* — Daniel Shook
(74) *Attorney, Agent, or Firm* — Horizon IP Pte. Ltd.

(57) ABSTRACT

Device and methods of forming a device are disclosed. The method includes providing a substrate defined with a memory cell region. A first upper dielectric layer is provided over the substrate. The first upper dielectric layer includes a first upper interconnect level with one or more metal lines in the memory cell region. A second upper dielectric layer is provided over the first upper dielectric layer. The second upper dielectric layer includes a via plug coupled to the metal line of the first upper interconnect level. An alignment trench which extends from a top surface of the second upper dielectric layer to a portion of the second upper dielectric layer is formed. Various layers of a MTJ stack are formed over the second upper dielectric layer. Profile of the alignment trench is transferred to surfaces of the various layers of the MTJ stack to form a topography feature which serves as an alignment mark. The various layers of the MTJ stack are patterned to form a MTJ element using the alignment mark visible in top surface of the various layers of the MTJ stack to align the memory element to the underlying via plug.

20 Claims, 18 Drawing Sheets

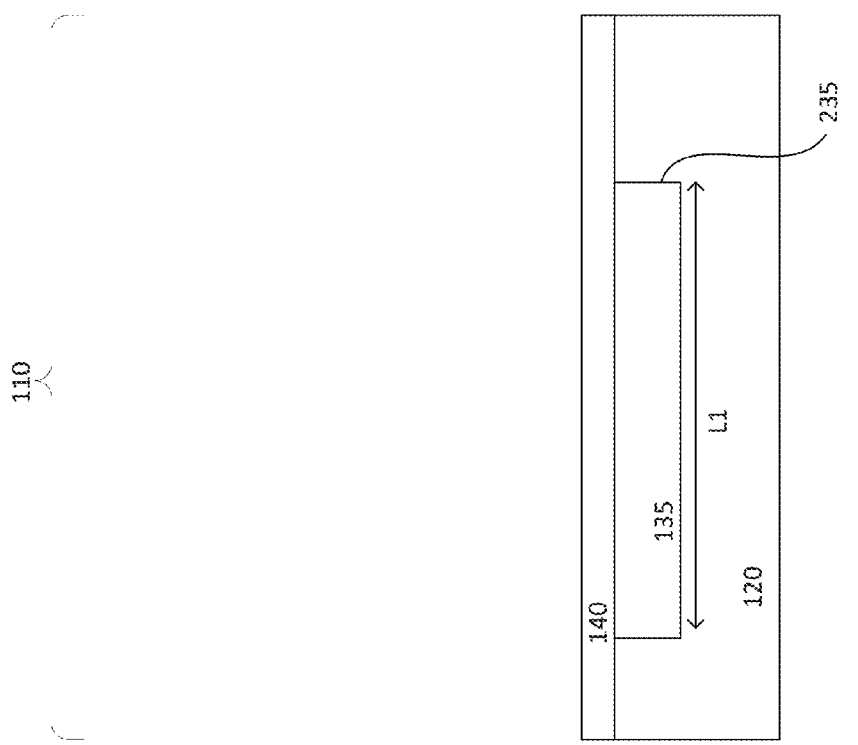

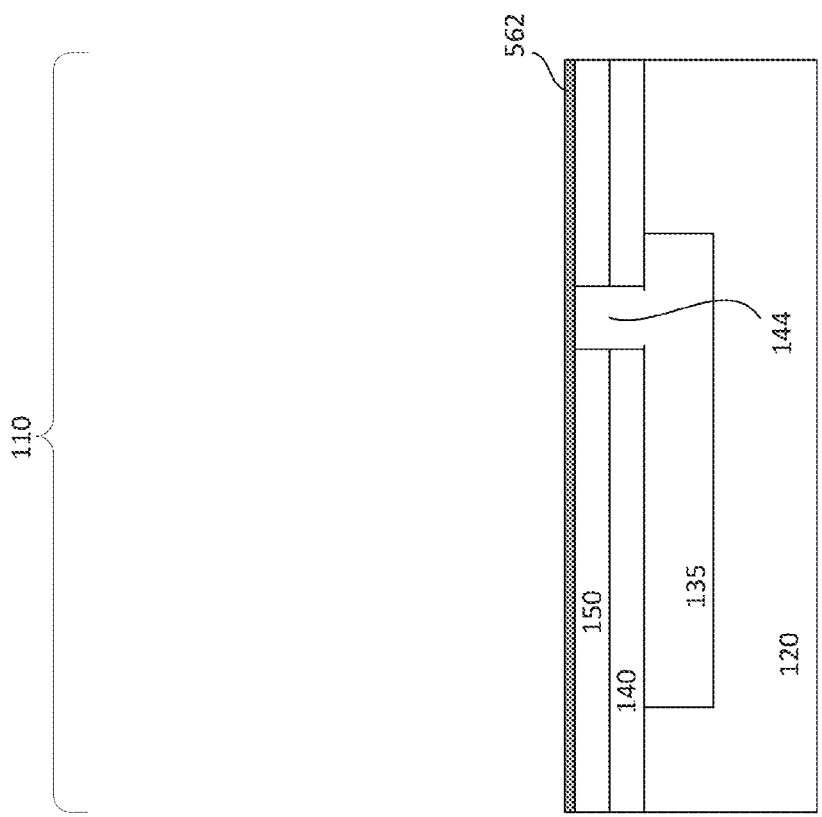

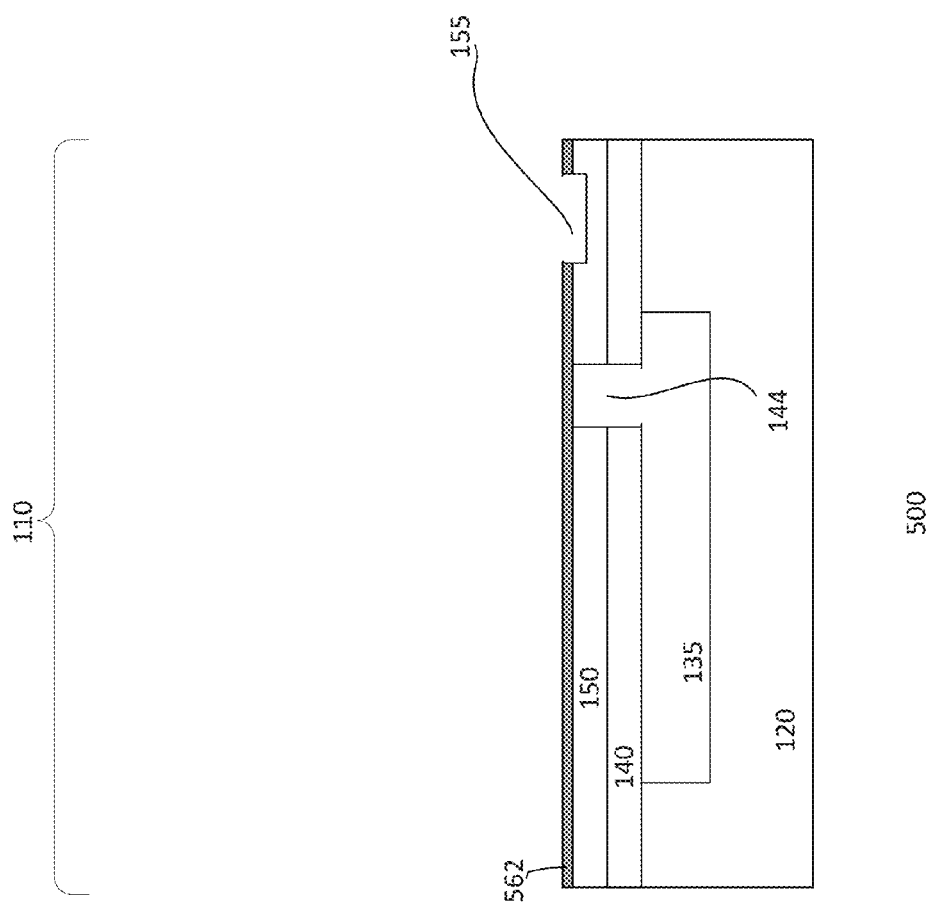

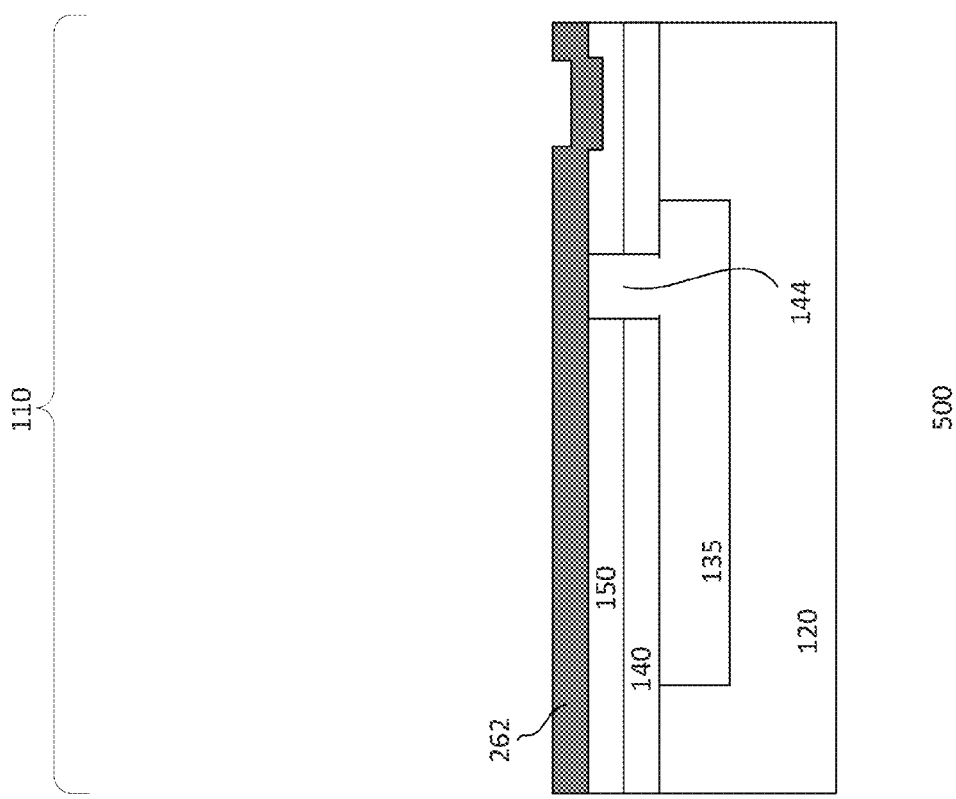

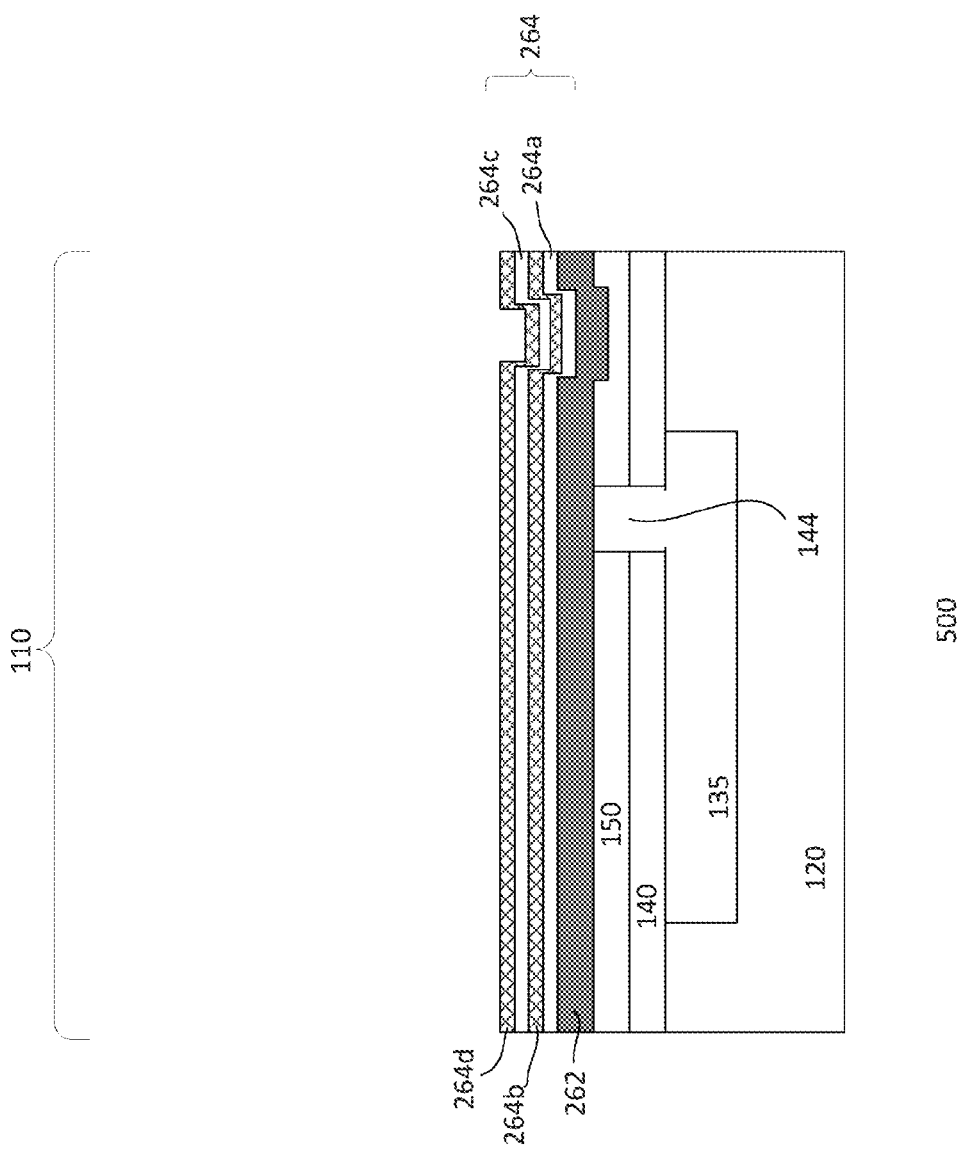

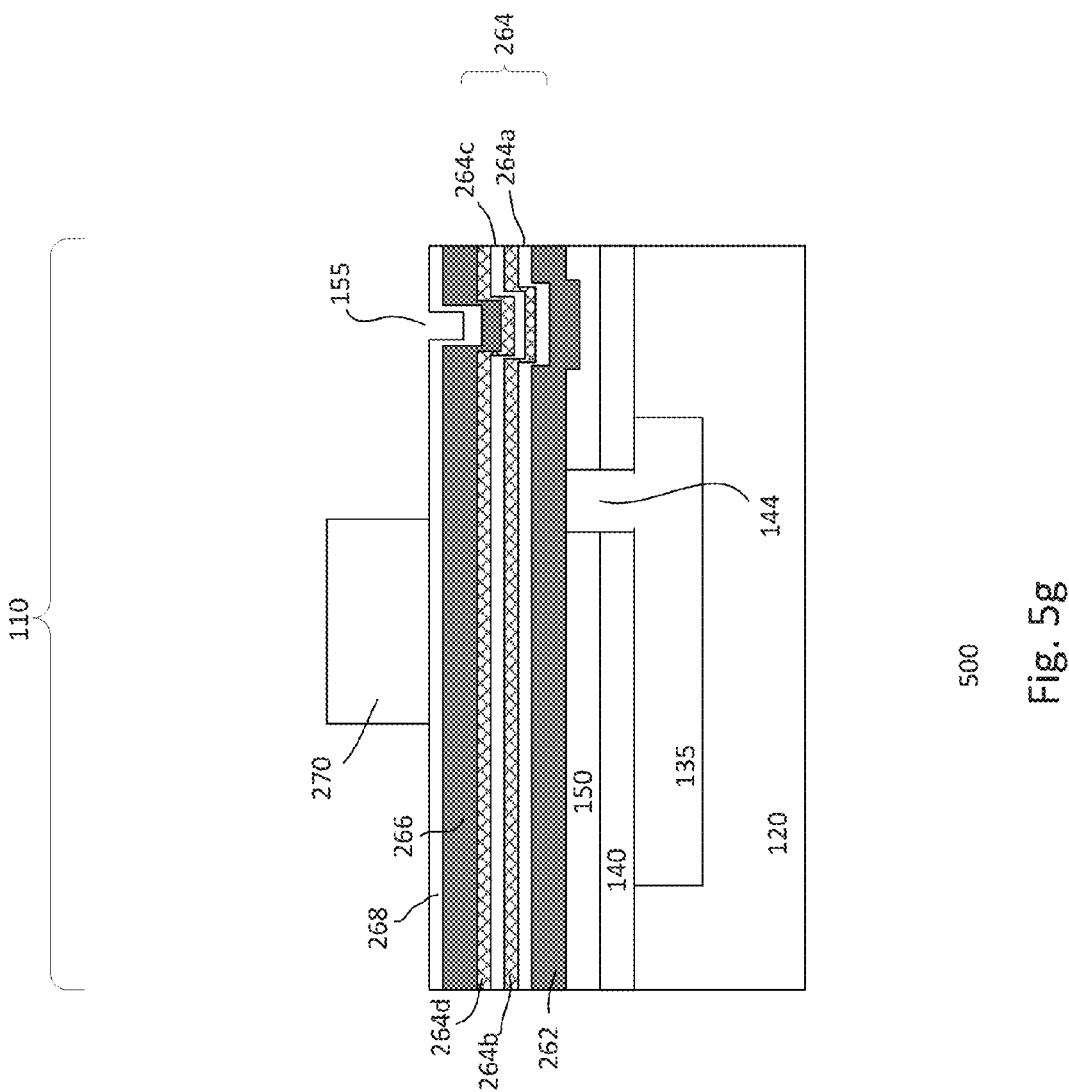

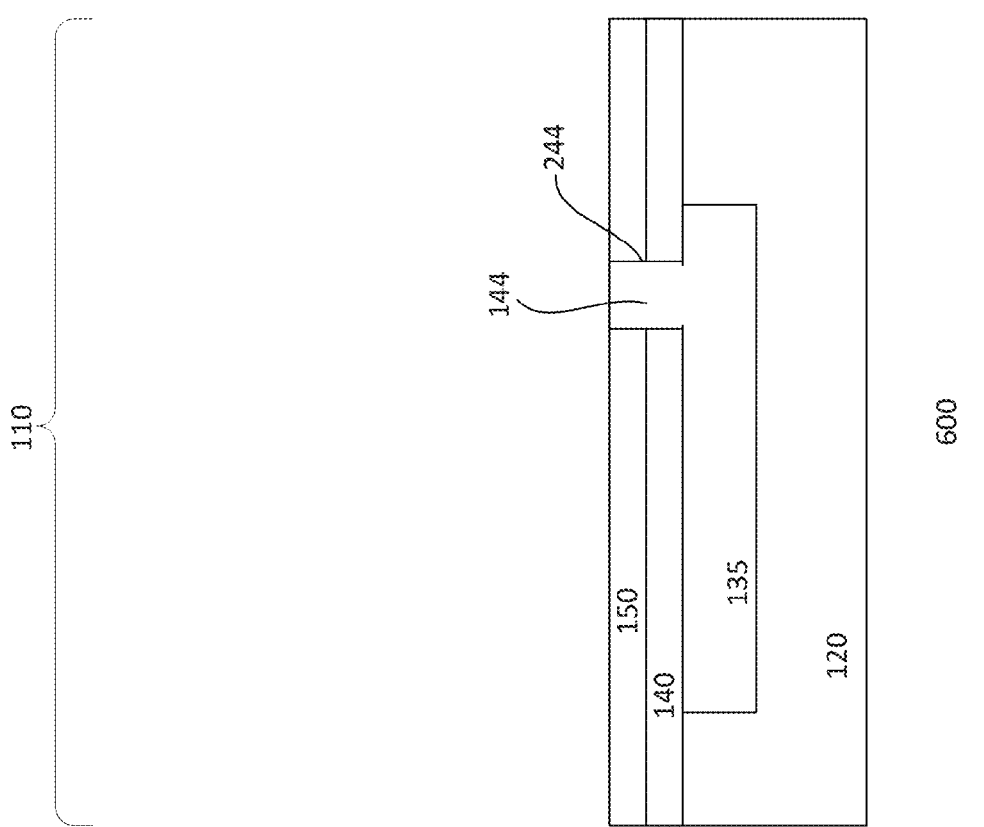

MAGNETIC TUNNEL JUNCTION STACK ALIGNMENT SCHEME

CROSS-REFERENCE TO RELATED APPLICATION

This application claims the priority benefit of U.S. Provisional Application Ser. No. 62/054,995, filed on Sep. 25, 2014, which is hereby incorporated by reference in its entirety for all purposes.

BACKGROUND

Magnetic random access memory (MRAM) is a non-volatile random access memory which gains popularity in recent years as potential replacement for dynamic random access memory (DRAM), static random access memory (SRAM) and flash. MRAM, for example, includes magnetic tunnel junction (MTJ) element which uses magnetic polarization to store information. MRAM device, for example, includes MTJ stack layers having a plurality of magnetic layers. The MTJ stack layers are generally connected to interconnects in the interlevel dielectric (ILD) layer. The various MTJ stack layers, however, are not transparent to light. Thus, when the various MTJ stack layers are patterned using lithography and etch techniques, the patterned MTJ stack layers may not be aligned to the underlying interconnect structures due to non-transparent metal layers of the MTJ stack and thus fail to couple to the underlying interconnect structures. This may render the MRAM device inoperable.

Accordingly, it is desirable to provide reliable and cost effective techniques to properly align the various MTJ stack layers with underlying interconnect structure to ensure electrical connection for the MRAM device.

SUMMARY

Embodiments of the present disclosure generally relate to semiconductor device and methods for forming a semiconductor device. In one aspect, a method of forming a device is disclosed. The method includes providing a substrate defined with a memory cell region. A first upper dielectric layer is provided over the substrate. The first upper dielectric layer includes a first upper interconnect level with one or more metal lines in the memory cell region. A second upper dielectric layer is provided over the first upper dielectric layer. The second upper dielectric layer includes a via plug coupled to the metal line of the first upper interconnect level. A protective layer is provided over the second upper dielectric layer and covers the via plug. An alignment trench which extends from a top surface of the protective layer to a portion of the second upper dielectric layer is formed. Various layers of a magnetic tunnel junction (MTJ) stack are formed over the second upper dielectric layer. Profile of the alignment trench is transferred to surfaces of the various layers of the MTJ stack to form a topography feature which serves as an alignment mark. The various layers of the MTJ stack are patterned to form a MTJ element using the alignment mark visible in top surface of the various layers of the MTJ stack to align the memory element to the underlying via plug.

In another aspect, a method of forming a device is disclosed. The method includes providing a substrate defined with a memory cell region. A first upper dielectric layer is provided over the substrate. The first upper dielectric layer includes a first upper interconnect level with one or more metal lines in the memory cell region. A second upper dielectric layer is provided over the first upper dielectric layer. The second upper dielectric layer includes a via plug coupled to the metal line of the first upper interconnect level. An alignment en trench which extends from a top surface of the second upper dielectric layer to a portion of the second upper dielectric layer is formed. Various layers of a MTJ stack are formed over the second upper dielectric layer. Profile of the alignment trench is transferred to surfaces of the various layers of the MTJ stack to form a topography feature which serves as an alignment mark. The various layers of the MTJ stack are patterned to form a MTJ element using the alignment mark visible in top surface of the various layers of the MTJ stack to align the memory element to the underlying via plug.

In yet another aspect, a wafer is disclosed. The wafer includes a wafer substrate defined with at least a memory cell region. A first upper dielectric layer is disposed over the substrate. The first upper dielectric layer includes a first upper interconnect level with one or more metal lines in the memory cell region. A second upper dielectric layer is disposed over the first upper dielectric layer. The second upper dielectric layer includes a via plug coupled to the metal line of the first upper interconnect level. Art alignment trench is disposed in the second upper dielectric layer. The alignment trench extends from a top surface of the second upper dielectric layer to a portion of the second upper dielectric layer. A magnetic tunnel junction (MTJ) stack is disposed over the second upper dielectric layer. The MTJ stack is aligned and coupled to the underlying via plug based on the alignment trench.

These and other advantages and features of the embodiments herein disclosed, will become apparent through reference to the following description and the accompanying drawings. Furthermore, it is to be understood that the features of the various embodiments described herein are not mutually exclusive and can exist in various combinations and permutations.

BRIEF DESCRIPTION OF THE DRAWINGS

In the drawings, like reference characters generally refer to the same parts throughout the different views. Also, the drawings are not necessarily to scale, emphasis instead generally being placed upon illustrating the principles of the disclosure. In the following description, various embodiments of the present disclosure are described with reference to the following drawings, in which:

FIGS. 5a-5h show cross-sectional views of an embodiment of a process for forming a device; and FIGS. 6a-6e show cross-sectional views of another embodiment of a process for forming a device.

DETAILED DESCRIPTION

Embodiments of the present disclosure generally relate to memory device and methods for forming a memory device. The embodiments generally relate to methods of aligning memory stack layers and subsequently formed layers to underlying conductive via plug of a memory device. This may be achieved by transferring the previous level topography into subsequently formed layers to serve as an alignment mark. The memory device, for example, may be spin transfer torque magnetic random access memory (STT-MRAM) device. The memory device includes memory cell having MTJ element. Other suitable types of memory devices may also be useful. Such memory device can be incorporated into standalone memory devices including, but not limited to, USB or other types of portable storage units, or ICs, such as microcontrollers or system on chips (SoCs). The devices or ICs may be incorporated into or used with, for example, consumer electronic products, or relate to other types of devices.

Figure 1:
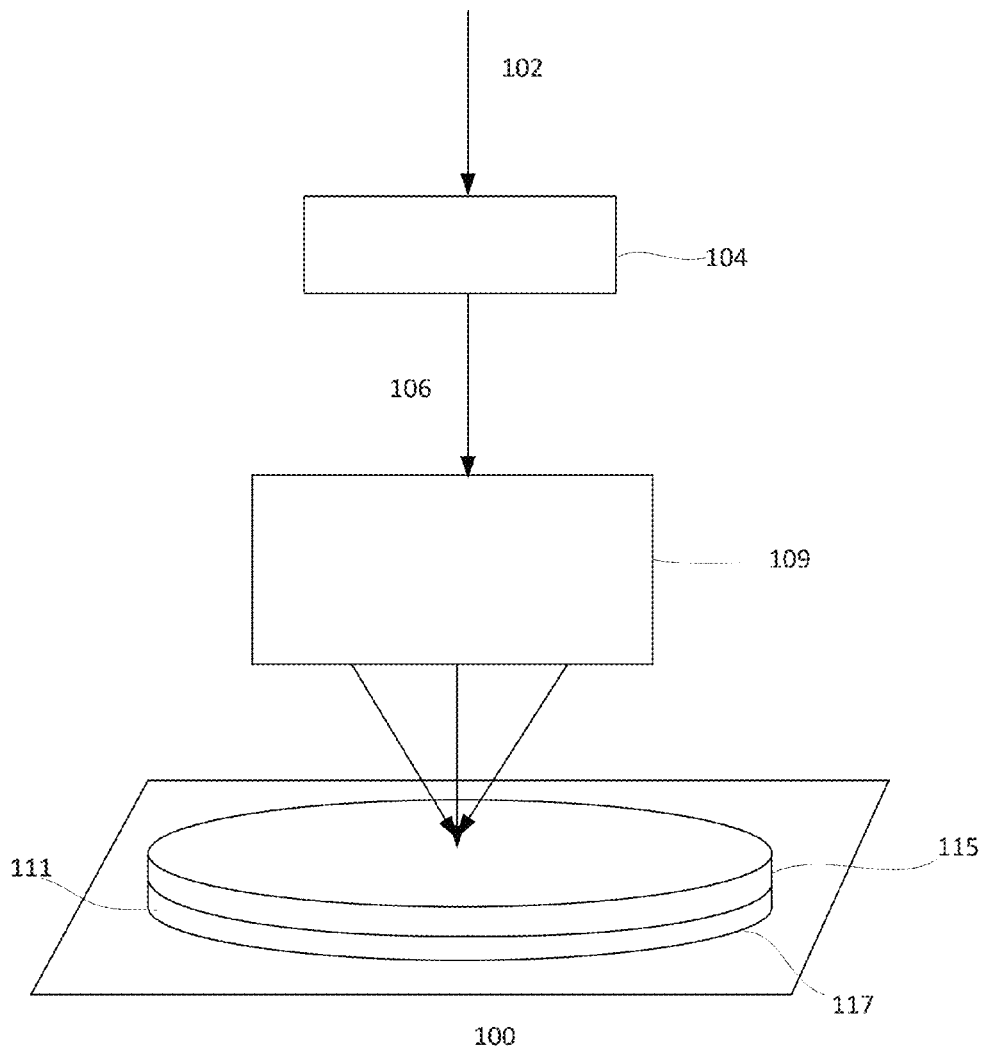
FIG. 1 shows a simplified diagram of a portion of an exemplary lithography system.

FIG. 1 shows a simplified portion of an exemplary photolithography system 100 used for patterning a wafer to form features, such as circuit components. The photolithography system may include, for example, exposure, beam shaping and illumination sub-systems (not shown). The exposure sub-system, for example, includes an exposure source for generating electromagnetic radiation (EMR). In one embodiment, the EMR is used in extreme ultra-violet (EUV) lithography. The EMR is passed through the beam shaping sub-system, which may include a collimator and monochromator to prepare an EMR beam (e.g., EMR operating beam). The EMR operating beam is passed through the illumination sub-system. The illumination sub-system, for example, may include mirrors and/or lenses. The illumination sub-system conducts the EMR operating beam 102 to a mask or reticle 104 having a desired pattern mask pattern).

In one embodiment, the reticle is a transmissive reticle. For example, the reticle transmits the EMR operating beam through it. The transmitted EMR beam 106 is a patterned beam having the pattern of the reticle. Other types of reticles, such as reflective reticles, can also be employed. For example, the reflective reticle reflects the EMR operating beam, creating a reflected patterned beam.

The patterned beam is projected onto the wafer 111. In one embodiment, the wafer is disposed on a translation stage 117. In one embodiment, the patterned beam is projected onto the wafer by a projection sub-system 109. The projection sub-system may include mirrors and/or lenses for projecting the patterned beam onto a portion of the wafer. The wafer includes a photoresist layer 115 which is exposed by the patterned beam. For example, the image of the patterned beam is imaged onto the photoresist layer. The patterned beam exposes a portion of the wafer with the image of the reticle. The exposed portion corresponds to a device region on which a device is formed. After exposing the portion, the stage may be translated to expose a next portion of the wafer. The exposure process repeats until the complete wafer is exposed. Processing a wafer using other types of lithographic or printing systems may also be useful.

After the wafer has been exposed, the photoresist is developed, transferring the pattern of the reticle to the resist layer. An anti-reflective coating (ARC) may be provided beneath the resist layer to improve lithographic resolution. The patterned resist layer serves as an etch mask. For example, an anisotropic etch, such as a reactive ion etch (RIE), patterns the wafer using the etch mask. Depending on the stage of process, the etch may etch a bare wafer, a layer on the wafer, or multiple layers on the wafer.

After processing of the wafer is completed, the wafer is diced along the scribe lane or dicing channel to produce individual dies. The dies may be processed to include package bumps. For example, wafer level packaging may be performed prior to dicing the wafer. The dies may be packaged and mounted onto an external component, such as a package substrate or a circuit board.

Figure 2:
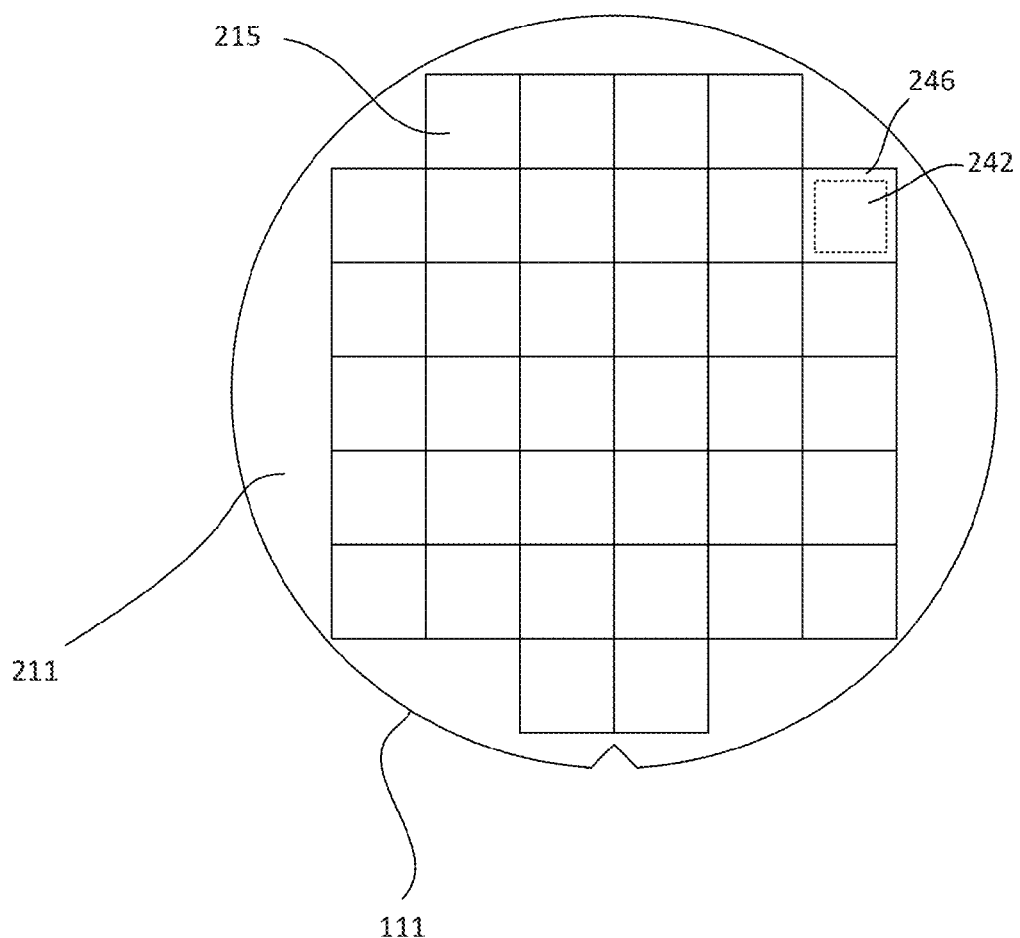
FIG. 2 shows a simplified plan view of a portion of an embodiment of a semiconductor wafer.

FIG. 2 shows a simplified plan view of a portion of an embodiment of a semiconductor wafer 111. The semiconductor wafer, for example, may be a silicon wafer. Other types of wafers are also useful. For example, the wafer may be a p-type or n-type doped wafer.

The wafer includes a surface 211 on which a plurality of devices 215 are formed. The plurality of devices may be formed on the wafer in parallel. The devices, for example, are arranged in rows along a first (x) direction and columns along a second (y) direction. A device, as shown, includes a main device region 242 and a frame or perimeter region 246. The main device region includes features and interconnections of the die. As for the perimeter region, it surrounds the main device region. The perimeter region, for example, serves as the scribe lanes or dicing channels 246 on the wafer, separating adjacent devices. The devices are singulated by dicing the wafer along the scribe lanes or dicing channels.

Figure 3:
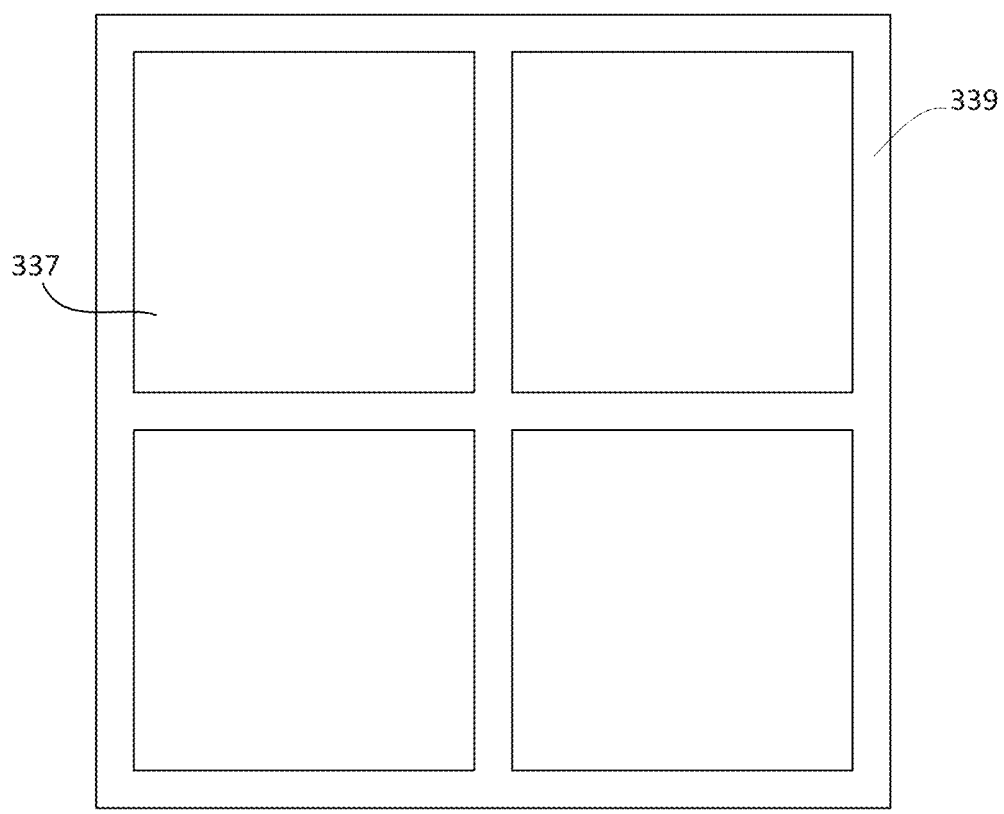
FIG. 3 shows a simplified plan view of an embodiment of a portion of a reticle used in exposing a wafer.

FIG. 3 shows an embodiment of a portion of the reticle 104 used in exposing the wafer 111. As shown, the reticle includes prune or main regions 337. The main region, for example, may be referred to as the device region. The device region includes a pattern which, for example, corresponds to the pattern to be formed in the device. The reticle creates patterns of devices in the main device regions on the wafer. A frame region 339 surrounds the device region. The frame region, for example, corresponds to perimeter regions or scribe lanes on the wafer. The frame region surrounds the devices on the wafer. The reticle is used to create desired patterns for respective levels on the device. In forming the dies, several reticles may be employed.

Figure 4A:
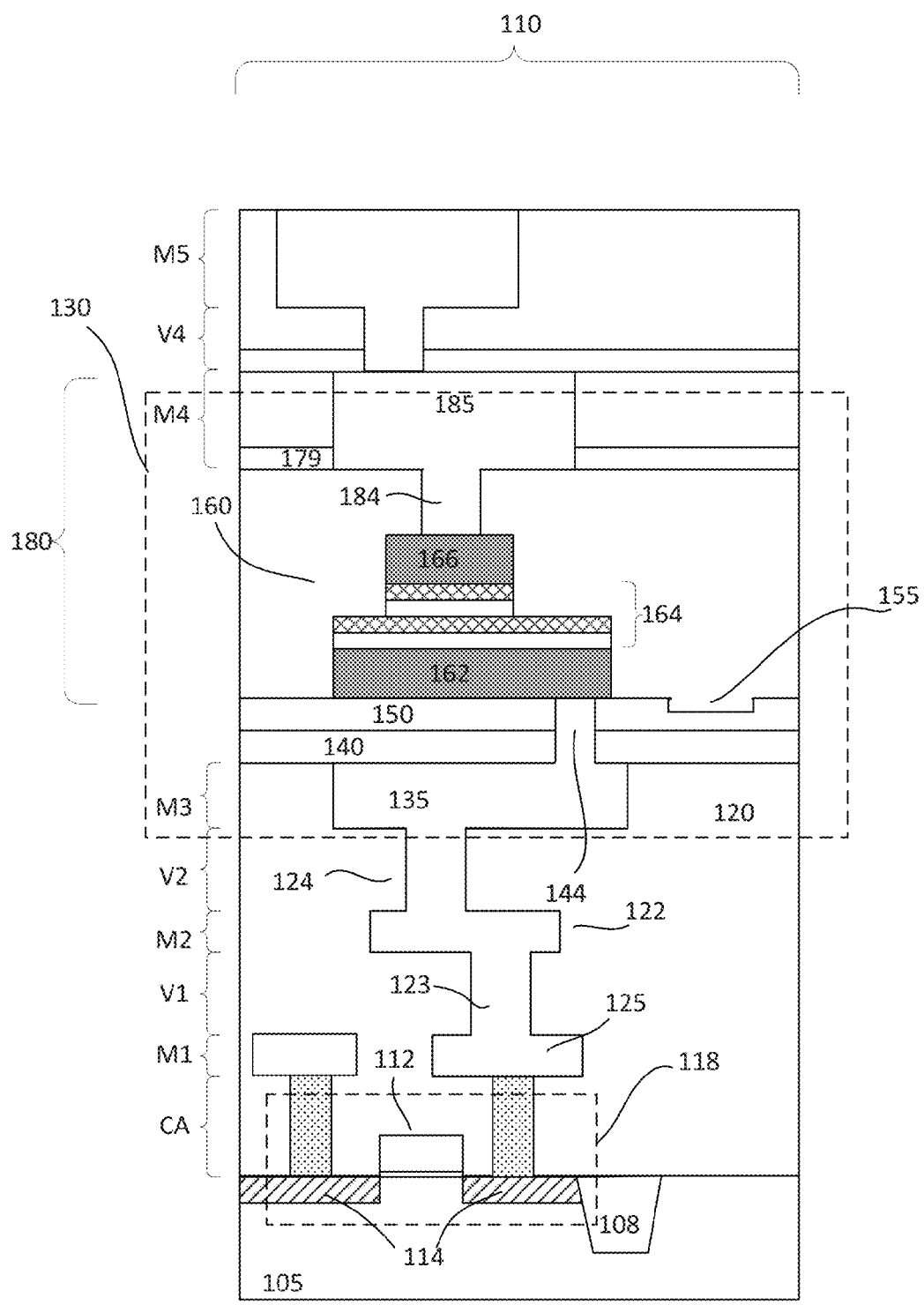
FIG. 4a shows cross-sectional views of a memory cell region of an embodiment of a device and FIG. 4b shows enlarged cross-sectional view of memory portion of the device.
Figure 4B:
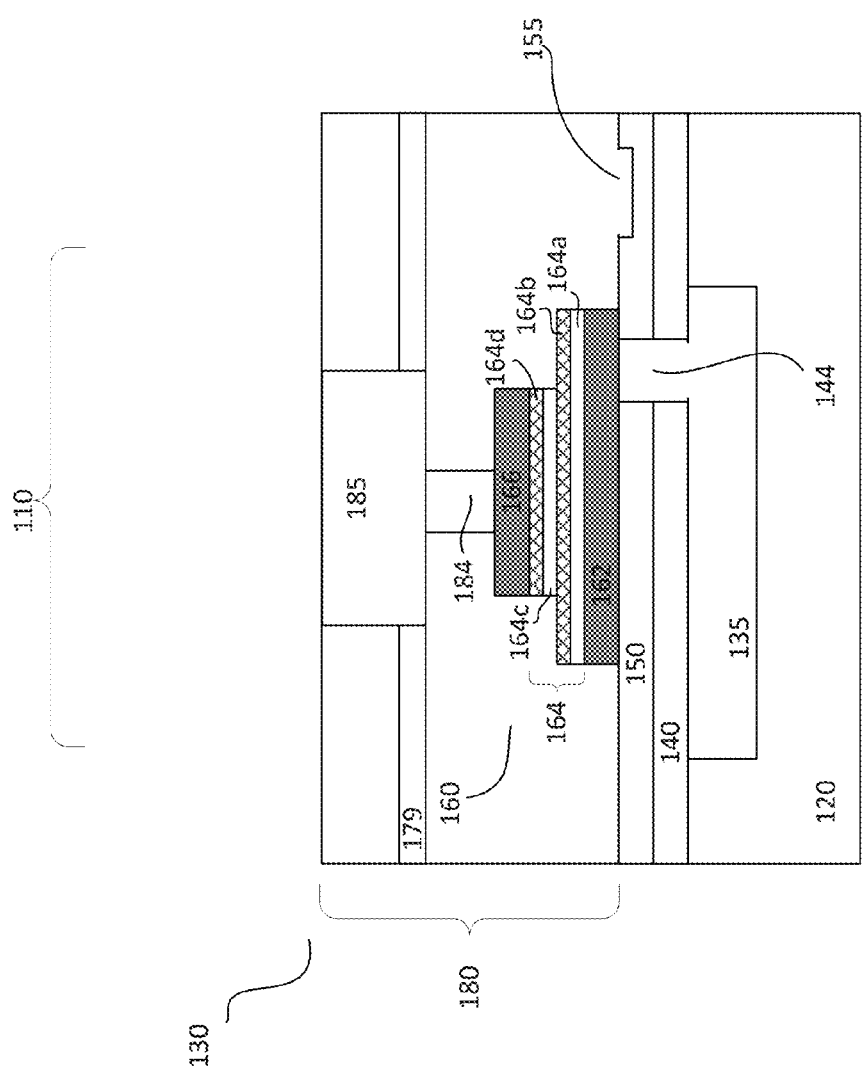

FIG. 4a shows a cross-sectional view of a memory cell region of an embodiment of device 400. FIG. 4b shows enlarged cross-sectional view of a memory portion 130 of the device. The cross-sectional view, for example is along a second or bitline direction of the device. The device, as shown, includes a memory cell 160 and cell selector unit or transistor 118. The memory cell, for example, may be a NVM memory cell. The memory cell, in one embodiment, is a magnetoresistive NVM cell, such as a STT-MRAM cell. Other suitable type of memory cell may also be useful.

The memory cell is disposed on a substrate 105. For example, the memory cell is disposed in the memory cell region 110 of the substrate. The memory cell region may be part of an array region. For example, the array region may include a plurality of memory cell regions. The substrate may include other types of device regions (not shown), such as high voltage (HV), low voltage (LV) and intermediate voltage (IV) device regions. Other types of regions may also be provided.

The substrate, for example, is a semiconductor substrate, such as a silicon substrate. For example, the substrate may be a lightly doped p-type substrate. Providing an intrinsic or other types of doped substrates, such as silicon-germanium (SiGe), germanium (Ge), gallium-arsenic (GaAs) or any other suitable semiconductor materials, may also be useful. In some embodiments, the substrate may be a crystalline-on-insulator (COI) substrate. A COI substrate includes a surface crystalline layer separated from a crystalline bulk by an insulator layer. The insulator layer, for example, may be formed of a dielectric insulating material. The insulator layer, for example, is formed from silicon oxide, which provides a buried oxide (BOX) layer. Other types of dielectric insulating materials may also be useful. The COI substrate, for example, is a silicon-on-insulator (SOI) substrate. For example, the surface and bulk crystalline layers are single crystalline silicon. Other types of COI substrates may also be useful. It is understood that the surface and bulk layers need not be formed of the same material. The substrate may be a part of the wafer 111 as described in FIGS. 1 and 2 which is processed in parallel to form a plurality of devices.

Front end of line (FEOL) processing is performed on the substrate. The FEOL process, for example, forms n-type and p-type devices or transistors in the memory cell region as well as other regions on the substrate. The p-type and n-type device form a complementary MOS (CMOS) device. The FEOL processing, for example, includes forming isolation regions, various device and isolation wells, transistor gates and transistor source/drain (S/D) regions and contact or diffusion regions serving as substrate or well taps. Forming other components with the FEOL process may also be useful.

As shown, the FEOL processing forms a memory cell region 110 isolated by an isolation region 108, such as a shallow trench isolation (STI) region. The memory cell region is for a memory cell. Isolation regions may be provided to isolate columns of memory cells. Other configurations of isolation regions may also be useful. The cell region may include a cell device well (not shown). The cell device well, for example, serves as a body well for a cell select transistor 118 of the memory cell 160. The cell device well may be doped with second polarity type dopants for first polarity type cell select transistor. The device well may be lightly or intermediately doped with second polarity type dopants. In some cases, a cell device isolation well (not shown) may be provided, encompassing the cell device well. The isolation well may have a dopant type which has the opposite polarity to that of the cell device well. For example, the isolation well may include first polarity type dopants. The isolation well serves to isolate the cell device well from the substrate. Well biases may be provided to bias the wells.

The cell device well may be a common well for the cell regions in the array region. For example the cell device well may be an array well. The cell device isolation well may serve as the array isolation well. Other configurations of device and isolation wells may also be useful. Other device regions of the device may also include device and/or device isolation wells.

The FEOL forms the cell selector unit 118 in the memory cell region. The cell selector unit includes a selector for selecting the memory cell 160. The selector, for example, may be a select transistor. In one embodiment, the select transistor is a metal oxide semiconductor (MOS) transistor. The transistor, as shown, includes first and second source/drain (S/D) regions 114 formed in the substrate 105 and a gate 112 disposed on the substrate between the S/D regions. The S/D regions, for example, are heavily doped regions with first polarity type dopants, defining the first type select transistor. For example, in the case of a n-type transistor, the S/D regions are n-type heavily doped regions. Other types of transistors or selectors may also be useful. As for the gate 112, it includes a gate electrode over a gate dielectric. The gate electrode may be polysilicon while the gate dielectric may be silicon oxide. Other types of gate electrode and gate dielectric materials may also be useful. A gate, for example, may be a gate conductor along a first or word line direction. The gate conductor forms a common gate for a row of memory cells.

A S/D region 114 may include LDD and halo regions (not shown). Dielectric spacers (not shown) may be provided on the gate sidewalls of the transistor to facilitate forming transistor halo, LDD and transistor S/D regions. It is understood that not all transistors include LDD and/or halo regions.

After forming the cell selector unit in the memory cell region and other transistors, back end of line (BEOL) processing is performed. The BEOL process includes forming interconnects in interlevel dielectric (ILD) layers. The interconnects connect the various components of the IC to perform the desired functions. An ILD level includes a metal level 122 and a contact level 124. Generally, the metal level includes conductors or metal lines 125 while the contact level includes via contacts 123. The conductors and contacts may be formed of a metal, such as copper, copper alloy, aluminum, tungsten or a combination thereof. Other suitable types of metal, alloys or conductive materials may also be useful. In some cases, the conductors and contacts may be formed of the same material. For example, in upper metal levels, the conductors and contacts may be formed by dual damascene processes. This results in the conductors and contacts having the same material. In some cases, the conductors and contacts may have different materials. For example, in the case where the contacts and conductors are formed by single damascene processes, the materials of the conductors and contacts may be different. Other techniques, such as reactive ion etch (RIE) may also be employed to form metal lines.

A device may include a plurality of ILD layers or levels. For example, x number of ILD levels may be provided. As illustrated, the device includes 5 ILD levels (x=5). Other number of ILD levels may also be useful. The number of ILD levels may depend on, for example, design requirements or the logic process involved. A metal level of an ILD level may be referred to as $M_i$, where i is from 1 to x and is the $i^{th}$ ILD level of x ILD levels. A contact level of an ILD level may be referred to as $V_{i-1}$, where i is the $i^{th}$ ILD level of x ILD levels.

The BEOL process, for example, commences by forming a dielectric layer over the transistors and other components formed in the FEOL process. The dielectric layer may be silicon oxide. For example, the dielectric layer may be silicon oxide formed by chemical vapor deposition (CVD). The dielectric layer serves as a premetal dielectric layer or first contact layer of the BEOL process. The dielectric layer may be referred to as CA level of the BEOL process. Contacts are formed in the CA level dielectric layer. The contacts may be formed by a single damascene process. Via openings are formed in the dielectric layer using mask and etch techniques. For example, a patterned resist mask with openings corresponding to the vias is formed over the dielectric layer. An anisotropic etch, such as RIE, is performed to form the vias, exposing contact regions below, such as S/D regions and gates. A conductive layer, such as tungsten is deposited on the substrate, filling the openings. The conductive layer may be formed by sputtering. Other techniques may also be useful. A planarization process, such as chemical mechanical polishing (CMP), is performed to remove excess conductive material, leaving contact plugs in the CA level.

After forming contacts in the CA level, the BEOL process continues to form dielectric layer over the substrate, covering the CA level dielectric layer. The dielectric layer, for example, serves as a first metal level M1 of the first ILD layer. The first ILD layer, for example, is a silicon oxide layer. Other types of dielectric layers may also be useful. The dielectric layer may be formed by CVD. Other techniques for forming the dielectric layer may also be useful.

Conductive lines 125 are formed in the M1 level dielectric layer. The conductive lines may be formed by a damascene technique. For example, the dielectric layer may be etched to form trenches or openings using, for example, mask and etch techniques. A conductive layer is formed on the substrate, filling the openings. For example, a copper or copper alloy layer may be formed to fill the openings. The conductive material may be formed by, for example, plating, such as electro or electroless plating. Other types of conductive layers or forming techniques may also be useful. Excess conductive materials are removed by, for example, CMP, leaving planar surface with the conductive line and M1 level dielectric layer. The first metal level M1 and CA may be referred as a lower ILD level.

The process continues to form additional ILD layers or upper ILD layers/levels. The additional ILD levels may include ILD level 2 to ILD level x. For example, in the case where x=5 (5 levels), the additional levels include ILD levels from 2 to 5, which includes M2 to M5. The number of ILD layers may depend on, for example, design requirements or the logic process involved. The ILD layers may be formed of silicon oxide. Other types of dielectric materials, such as low k, high k or a combination of dielectric materials may also be useful. The ILD layers may be formed by, for example, CVD. Other techniques for forming the ILD layers may also be useful.

The conductors and contacts of the additional ILD layers may be formed by dual damascene techniques. For example, vias and trenches are formed, creating dual damascene structures. The dual damascene structure may be formed by, for example, via first or via last dual damascene techniques. Mask and etch techniques may be employed to form the dual damascene structures. The dual damascene structures are filled with a conductive layer, such as copper or copper alloy. The conductive layer may be formed by, for example, plating techniques. Excess conductive material is removed by, for example, CMP, forming conductors and contacts in an ILD layer.

A dielectric liner (not shown) may be disposed between ILD levels and on the substrate. The dielectric liner, for example, serves as an etch stop layer. The dielectric liner may be formed of a low k dielectric material. For example, the dielectric liner may be nBLOK. Other types of dielectric materials for the dielectric liner may also be useful.

The uppermost ILD level (e.g., M5) may have different design rules, such as critical dimension (CD), than the lower ILD levels. For example, Mx may have a larger CD than metal levels M1 to Mx−1 below. For example, the uppermost metal level may have a CD which is 2× or 6× the CD of the metal levels below.

As shown, S/D contacts are disposed in the CA level. The S/D contacts are coupled to the first and second S/D regions of the select transistor. Other S/D contacts to other S/D regions of transistors may also be provided. The CA level may include a gate contact (not shown) coupled to the gate of the select transistor. The gate contact may be disposed in another cross-section of the device. The gate contact is coupled to a wordline (WL) which may be provided by the gate or provided in any suitable metal level. The contacts may be tungsten contacts. Other types of contacts may also be useful. Other S/D and gate contacts for other transistors may also be provided.

As described, metal lines are provided in M1. The metal lines are coupled to the S/D contacts. In one embodiment, a SL is coupled to the second S/D region of the select transistor. As for the first S/D contact, it may be coupled to contact pad or island in M1. The contact pads provide connections to upper ILD levels. The metal lines or pads may be formed of copper or copper alloy. Other types of conductive material may also be useful.

As for the additional ILD levels, for example, from 2 to 5, they include contacts 123 in the via level 124 and contact pads/metal lines 125 in the metal level 122. The contacts and contact pads provide connection from M5 to the first S/D region of the select transistor.

As shown in FIG. 4*a*, the memory cell region 110 accommodates a MRAM cell 160. The MRAM cell is generally disposed in between adjacent metal levels of upper ILD level. In one example, the MRAM cell is formed in between adjacent upper ILD levels, such as upper ILD level 3 to 4. It is understood that the MRAM cell may be disposed in between any suitable adjacent ILD levels. For illustration purpose, the memory portion 130 of the device shown in FIG. 4*b* shows a dielectric layer 120 which corresponds to upper ILD level 3. The upper ILD level 3, for example, includes a via level and a metal level. The upper ILD level 3, for example, includes via level V2 and metal level M3. One or more via contacts (not shown) may be disposed in V2 in the memory cell region 110.

For the sake of simplicity, the dielectric layer 120 in this disclosure may be referred to as a first upper dielectric layer and its via and metal levels may be referred to as a first upper interconnect level. As shown, a metal line 135 is disposed in the metal level (e.g., M3) of the first upper dielectric layer 120. The metal line 135, for example, is coupled to the MRAM cell 160 which will be described later. The metal line 135, for example, may serve as a bitline (BL) or may be used for connection purpose. Although one metal line 135 is shown, it is understood that there could be other suitable number of metal lines in the same metal level.

The metal line 135 includes a conductive material. The conductive material, for example, includes copper (Cu). Other suitable types of conductive material may also be useful. The dimensions of this metal line 135 and its underlying via contact (not shown), for example, are defined at the minimum line resolution of the lithography and etch capability for a technology process node, which may be referred to as 1× design rule. The thickness of the metal line with reference to the top surface of the first upper dielectric layer 120, for example, is about 1400 Å. The metal line 135, for example, includes a length of about 200 nm when viewed in the bitline direction as shown in FIG. 4*a*-4*b*. Other suitable thickness and length dimensions may also be useful, depending on the design requirements of a technology node.

A dielectric liner 140 is disposed above the first upper dielectric layer 120 covering the metal line 135 in the cell region. The dielectric liner, for example, serves as an etch stop layer. The dielectric liner may be a low k dielectric liner. For example, the dielectric liner may be nBLOK. Other suitable types of dielectric materials for the dielectric liner may also be useful.

A second upper dielectric layer 150 is disposed on the first upper dielectric layer 120. For example, the second upper dielectric layer is disposed on the dielectric liner 140. The second upper dielectric layer, in one embodiment, is TEOS. Any suitable dielectric materials and thicknesses for the second upper dielectric layer may be useful. In one embodiment, a via plug 144 extends through the second upper dielectric layer 150 and dielectric liner 140 and is coupled to the metal line 135. The via plug, for example, includes a conductive material, such as Cu. Other suitable types of conductive material may also be useful.

The second upper dielectric layer 150, in one embodiment, includes an alignment trench 155. The alignment trench 155, in one embodiment, is disposed in the perimeter region or scribe lane as shown and described in FIG. 1b. In other embodiments, the alignment trench may be disposed in the device region. During processing, the alignment trench, for example, provides topographic feature which is used to align subsequently deposited memory or magnetic stack layers and subsequently formed layers of the memory cell. The topographic feature is also used as an alignment mark for patterning the magnetic stack layers such that the patterned layers are aligned and coupled to the underlying via plug 144 which will be described in FIGS. 5a-5h and FIGS. 6a-6e later.

A MRAM cell 160 is disposed over the second upper dielectric layer 150 in the cell region 110. In one embodiment, the MRAM cell is a STT-MRAM cell. Other suitable types of memory cells may also be useful. The MRAM cell includes a storage unit which is a magnetic memory element, such as a MTJ element.

The memory element includes first and second electrodes 162 and 166. The first electrode, for example, may be a bottom electrode while the second electrode may be a top electrode. Other configurations of electrodes may also be useful. In one embodiment, the bottom electrode 162 of the memory element is connected to the metal line 135 through the via plug 144.

The memory element includes a MTJ stack 164 disposed in between the top and bottom electrodes. The memory element, for example, may include a bottom-pinned MTJ element or a top-pinned MTJ element. Top and bottom refer to position of layers relative to the substrate surface. For illustration purpose, the MTJ stack, for example, includes four layers. It is understood that the MTJ stack may include any suitable number of layers. For example, the MTJ stack generally includes a magnetically fixed (pinned) layer 164a, one or more tunneling barrier layers 164b and 164d and a magnetically free layer 164c. The fixed layer includes a magnetic layer and a pinning layer. The pinning layer, for example, pins the magnetization direction of the magnetic layer, forming a pinned layer.

The free layer may be CoFeB, the tunneling barrier layer may be MgO or $Al_2O_3$, and the magnetic layer may be CoFeB/Ru/CoFeB. As for the pinning layer, it may be PtMn or IrMn. The top and bottom electrodes may be Ti, TiN, Ta, TaN or other suitable metals used in the semiconductor process. Other suitable configurations or materials of memory element may also be useful.

The top electrode and upper layers of the MTJ stack of the memory cell in the cell region, for example, include a length dimension which is smaller than a length dimension of the bottom electrode and lower layers of the MTJ stack. For example, the length of the top electrode and upper MTJ stack is about 85 nm while the length of the bottom electrode and lower MTJ stack is about 200 nm. Other suitable length dimensions may also be useful.

A dielectric layer 180 is disposed over the second upper dielectric layer 150, covering the memory cell. The dielectric layer and the second upper dielectric layer, for example, corresponds to upper ILD level 4. The dielectric layer, for example, is a dielectric stack having one or more dielectric layers. For instance, the dielectric layer 180 may include third, fourth, fifth and sixth or other suitable number of upper dielectric layers. The dielectric layer 180 includes TEOS. Other suitable configurations and materials for the dielectric layer may also be useful.

The dielectric layer 180, for example, includes a via contact 184 which couples a metal line 185 to the top electrode 166 of the memory cell. The metal line 185 is disposed in the metal level while the via contact is disposed in the via level. For simplicity, the via and metal levels of the dielectric layer 180 may be referred to as a second upper interconnect level. For example, the metal line 185 may be disposed in metal level M4 while the via contact may be disposed in via level V3. The metal line 185, for example, may serve as a bitline (BL). Providing the bitline at other metal level may also be useful. Although one metal line 185 is shown, it is understood that there could be other suitable number of metal lines in the same metal level.

The via contact 184, for example, may be referred to as the top via contact and the metal line 185, for example, may be referred to as the top metal line. The dimensions of this metal line 185 and its underlying via contact 184, for example, may be defined at twice the minimum line resolution of the lithography and etch capability for a technology process node, which may be referred to as 2× design rule. For example, the thickness of the top metal line 185, for example, may be at least 2 times greater than the thickness of the metal line 135 below. The top metal line 185 includes a thickness of for example, about 3600 Å and having a length of about 200 nm while the top via contact 184, for example, includes a length of about 110 nm when viewed in the bitline direction. Other suitable thickness and length dimensions may also be useful, depending on the design requirements of a technology node. The top via contact and top metal line include a conductive material, such as Cu. Other suitable configurations and conductive materials for the via contact and metal line may also be useful.

Referring back to FIG. 4a, additional dielectric liner and dielectric layer may optionally be disposed over the dielectric layer 180. One or more metal lines may be disposed in metal level M5 while one or more via contacts may be disposed in via level V4 of the additional dielectric layer. A pad level (not shown) may be disposed over the uppermost ILD level. For example, a pad dielectric level is disposed over Mx. In the case where the device includes 5 metal levels, the pad level is disposed over M5. The pad level includes a pad dielectric layer. The pad dielectric layer, for example, may be a silicon oxide layer. Other types of pad dielectric layer may also be useful. A pad interconnect (not shown) having a pad via contact and a contact pad is disposed in the pad level. The pad interconnect, for example, electrically connects to an interconnect in the uppermost ILD level (e.g., M5). The pad interconnect, for example, includes an aluminum pad interconnect. Other suitable conductive material may also be useful. A passivation layer may be disposed over the pad dielectric layer. An opening in the passivation layer exposes the contact pad for subsequent wire bonding to provide external connections to the device.

FIGS. 5a-5h show simplified cross-sectional views of a process 500 for forming an embodiment of a device. The device formed, for example, is similar to that shown and described in FIGS. 4a-4b. Thus, common elements and elements having the same reference numerals may not be described or described in detail.

For simplicity, the processing of a substrate to form transistors using FEOL and processing of lower ILD levels using BEOL are not shown. Referring to FIG. 5a, the process 500 is at the stage of providing a dielectric layer 120 over a substrate (not shown). The dielectric layer 120, for example, may correspond to upper ILD level 3. It is understood that the dielectric layer may correspond to other suitable ILD level. For the sake of simplicity and for illustration purpose, the dielectric layer 120 may be referred to as a first upper dielectric layer and its via and metal levels may be referred to as a first upper interconnect level.

The process includes forming suitable number of via openings (not shown) and trenches in the memory cell region 110. One or more via openings (not shown) and trenches 235 are formed in the memory cell region 110. A photoresist (not shown) is applied to the top surface of the first upper dielectric layer to define a pattern arrangement for fabricating the trenches. Portions of the first upper dielectric layer not protected by the photoresist are removed (e.g., by using an etching process) to form the trenches. The etching process, for example, may be an anisotropic etch, such as RIE. Other suitable removal process may also be employed.

The trench 235, for example, includes the same depth dimension defined by, for example, 1× design rule. The depth of the trench, for example, is about 1400 Å with reference to the top surface of the first upper dielectric layer. The trench includes a length L1 which is about, for example, 200 nm. Other suitable dimensions may also be useful, depending on design requirement of a technology node.

The process continues by depositing a conductive layer on top of the first upper dielectric layer and fills the trench. The conductive layer, for example, may be formed by CVD. The conductive layer, for example, includes Cu. Other suitable conductive materials and deposition techniques may also be employed. A CMP process is performed to remove excess conductive material on top of the first upper dielectric layer and to provide a substantially planar surface. The trench filled with conductive material forms a metal line 135. Although one metal line is shown, it is understood that there could be more than one metal line being formed. The metal line 135 may be coupled to a MRAM cell which will be formed later.

Referring to FIG. 5a, a dielectric liner 140 is formed above the first upper dielectric layer covering the metal line 135. The dielectric liner, for example, serves as an etch stop layer. The dielectric liner may be a low k dielectric liner. For example, the dielectric liner may be nBLOK. Other suitable types of dielectric materials for the dielectric liner may also be useful. The dielectric liner, for example, is formed by CVD. Other suitable techniques for forming the dielectric liner may also be useful.

Figure 5B:
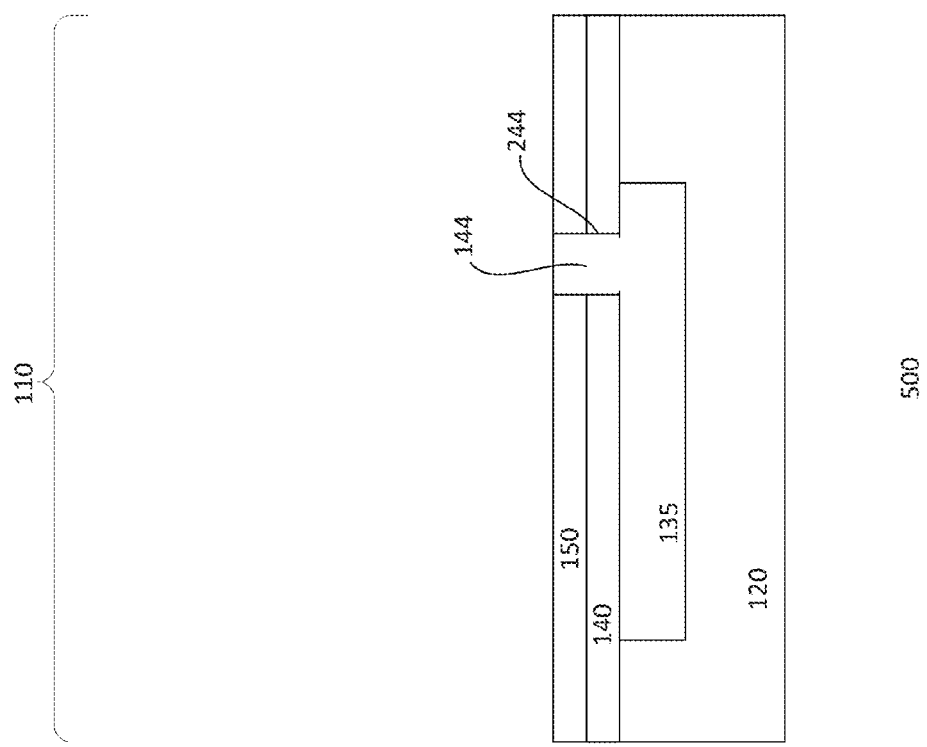

The process continues to form a second upper dielectric layer 150. As shown in FIG. 5b, a second upper dielectric layer 150 is formed on the first upper dielectric layer. For example, the second upper dielectric layer is formed on the dielectric liner 140. The second upper dielectric layer, for example, includes TEOS. The second upper dielectric layer may be formed by CVD. Any other suitable forming techniques or suitable materials and thicknesses for the second upper dielectric layer may also be useful.

In FIG. 5b, the second upper dielectric layer 150 and the dielectric liner 140 are patterned to form a via opening 244. The via opening, for example, exposes a portion of the metal line 135 in the metal level below. The opening may be formed by mask and etch techniques. For example, a patterned photoresist mask may be formed over the second upper dielectric layer, serving as an etch mask. An etch, such as RIE, may be performed to pattern the second upper dielectric layer and dielectric liner using the patterned resist etch mask. In one embodiment, the etch transfers the pattern of the mask to the second upper dielectric layer, including the dielectric liner to expose a portion of the metal line 135 below.

The process continues by depositing a conductive layer over the second upper dielectric layer and fills the via opening 244. The conductive layer, for example, may include Cu and may be formed by CVD. Other suitable conductive materials and deposition techniques may also be employed. A CMP process is performed to remove excess conductive material on top of the second upper dielectric layer and to provide a substantially planar surface. The via opening 244 filled with conductive material forms a via plug 144.

In one embodiment, the process continues to form a protective layer 562 over the second upper dielectric layer 150 and covers the via plug 144 as shown in FIG. 5c. The protective layer serves to protect the underlying via plug which is made of copper from oxidation during formation of an alignment trench later. The protective layer, in one embodiment, includes any suitable material which is the same as the material of a bottom electrode layer which will be formed thereon. For example, the protective layer includes Ti, TiN, Ta or TaN. The thickness of the protective layer is, for example, about 50 Å. Other suitable thickness dimension for the protective layer may also be useful, as long as it is sufficient to protect the underlying via plug from oxidation and is sufficiently thin to allow the underlying via plug 144 to be optically visible during formation of the alignment trench later. The protective layer, for example, is formed by physical vapor deposition (PVD). Other suitable forming techniques may also be employed.

A soft mask layer (not shown) is formed on the protective layer. The soft mask layer, in one embodiment, is a photoresist layer. The soft mask is patterned to form an opening corresponding to an alignment trench 155. To form the opening in the soft mask layer, it may be selectively exposed with an exposure source using a reticle. The pattern of the reticle is transferred to the photoresist layer after exposure by a development process. As shown, the protective layer 562 is sufficiently thin to enable the via plug to be optically visible such that the reticle having the alignment trench pattern can be aligned to the underlying via plug so that the alignment trench is formed near to the via plug. An etch is performed on the protective layer and the second upper dielectric layer. The etch, in one embodiment, is an anisotropic etch, such as a RIE, using the patterned resist layer as an etch mask. The etch forms the alignment trench 155. Although a single opening is shown corresponding to an alignment trench, the alignment trench may include a plurality of groups and subgroup of alignment trenches. The alignment trench, for example, may be rectangular or square or may include other suitable shapes.

The alignment trench, in one embodiment, is formed in the scribe lane as described in FIG. 1b. In other embodiments, the alignment trench may be formed in the device region. The alignment trench, in one embodiment, extends from a top surface of the protective layer to a portion of the second upper dielectric layer. The depth of the alignment trench, for example, is about 800 Å from the top surface of the protective layer and has a width of, for example, about 1.6 μm. Other suitable width and depth dimensions for the alignment trench may also be useful as long as it is sufficiently deep to create adequate topography to serve as an alignment mark for subsequent alignment of the MTJ stack and subsequent layers of the MRAM cell.

The process continues to form a MRAM cell. For example, various layers of memory element of the MRAM cell are sequentially formed over the protective layer 562. In one embodiment, a bottom electrode layer is conformally deposited over the protective layer as shown in FIG. 5e. The bottom electrode layer, for example, includes the same material as the protective layer. For example, the bottom electrode layer includes Ti, TiN, Ta or TaN. Since the protective layer and the bottom electrode layer include the same material, the bottom electrode layer is provided with suitable thickness such that the bottom electrode layer and the protective layer in combination provide for the desired thickness and good roughness for the bottom electrode 262 of the MRAM cell. The thickness of the bottom electrode layer, for example, is about 250 Å. Other suitable thickness dimension may also be useful. The bottom electrode layer 262, as shown, lines top surface of the protective layer and sidewalk and bottom of the alignment trench. As shown, the bottom electrode layer tracks the profile of the underlying layer.

The process continues to form various layers of the MTJ stack 264 over the bottom electrode layer 262. The various layers of the MTJ stack, for example, are formed by PVD process. Other suitable techniques may be used. For illustration purpose, the MTJ stack is shown to include four layers 264a-264d. It is understood that the MTJ stack may include other suitable number of layers. Materials of the various layers of the MTJ stack are the same as that described in FIGS. 4a-4b. As shown in FIG. 5f, the various layers of the MTJ stack are conformally formed and follow the profile of the underlying bottom electrode layer.

A top electrode layer 266 and a hard mask layer 268 are formed over the various layers of the MTJ stack 264 as shown in FIG. 5g. The top electrode layer, for example, includes the same material as the bottom electrode layer. For example, the top electrode layer includes Ti, TiN, Ta or TaN. The hard mask layer, for example, includes TEOS hard mask. These layers, for example, may be formed over the MTJ stack by CVD. Other suitable types of materials and forming techniques may be used for the top electrode and hard mask layers.

As shown in FIG. 5g, the profile of the alignment trench 155 is transferred to the surfaces of the bottom electrode layer, various layers of the MTJ stack and top electrode layer, creating adequate topography feature 155 which is visible from the top surface of the substrate. Thus, the topography may be used as the alignment mark during patterning to define the memory element later.

The process continues to pattern the top and bottom electrode layers and various layers of the MTJ stack. Patterning the layers may be achieved with mask and etch techniques. A soft mask layer 270, such as a photoresist layer, is formed on the hard mask layer. The soft mask is patterned to form a pattern which is used to define the pattern of the top electrode, the MTJ layers and the bottom electrode of the MRAM cell. To form the pattern in the mask layer, it may be selectively exposed with an exposure source using a reticle (not shown) such as that shown in FIG. 3. In one embodiment, the reticle (not shown) used to expose the resist layer is aligned using the alignment mark 155, which is visible as topography even after the deposition of the top electrode layer. The pattern of the reticle is transferred to the resist layer after exposure by a development process.

Figure 5H:
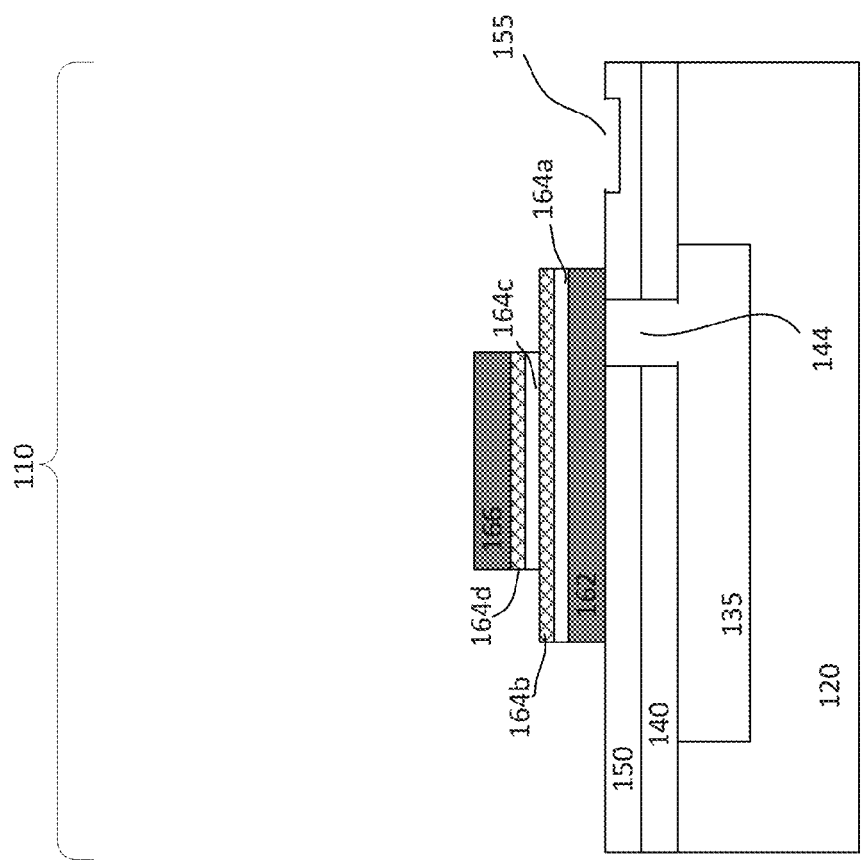

An etch process is performed to remove exposed hard mask layer, top and bottom electrode layers and various layers of the MTJ stack not protected by the patterned mask. The etch, for example, is an anisotropic etch, such as a RIE. Other suitable techniques for patterning the MTJ stack and top and bottom electrode layers may also be useful. The etch process stops when it reaches top surface of the second upper dielectric layer 150. Thus, the alignment mark, still observable as topography is used to define these layers and to ensure that these layers are coupled to the underlying via plug 144 as shown in FIG. 5h. The patterned bottom electrode 162, the fixed layer 164a and the tunnel barrier 164b of the memory cell, as shown, include a length which is greater than the length of the free layer 164c and tunnel barrier 164d of the MTJ stack 164 and top electrode 166 in the bitline direction such that it is easy for process control and to prevent electrical shorts between the top and bottom electrodes as well as to prevent electrical shorts between the free and fixed layers of the MTJ stack. The soft mask is removed thereafter.

The process may continue to form additional upper dielectric layers with interconnects therein and to complete formation of the IC. The process, for example, may continue to form passivation layer and pad interconnects or bonding pads. Further processing can include final passivation, dicing, assembly and packaging. Other processes are also useful.

FIGS. 6a-6e show another embodiment of a process 600 for forming a device. The process 600 is similar to that described in FIGS. 5a-5h and the device formed, for example, is similar to that shown and described in FIGS. 4a-4b. Thus, common elements and elements having the same reference numerals may not be described or described in detail.

Referring to FIG. 6a, the process 600 is at the same stage as that shown in FIG. 5b. For example, a dielectric liner 140 and second upper dielectric layer 150 are formed over the first upper dielectric layer 120, covering the metal line 135. A via plug 144 is formed through the second upper dielectric layer and the dielectric liner and is coupled to the metal line 135.

Figure 6B:
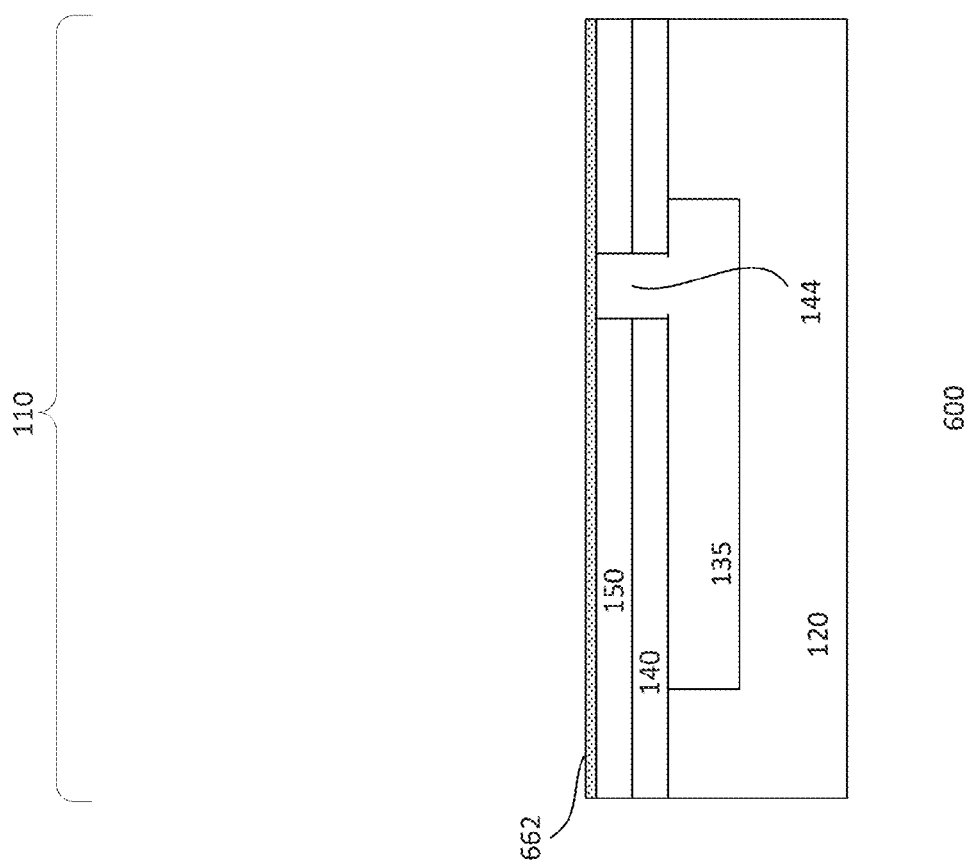
Figure 6C:
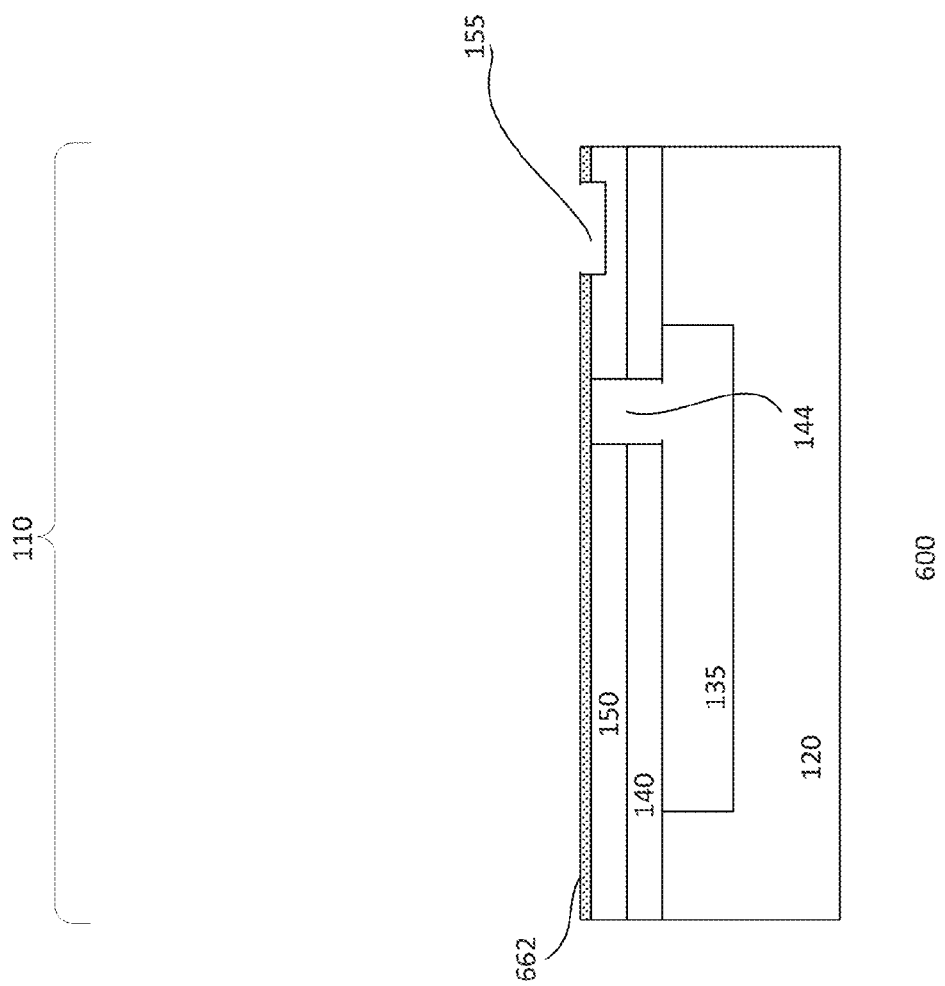

In one embodiment, the process continues to form a protective layer 662 over the second upper dielectric layer 150 and covers the via plug 144 as shown in FIG. 6b. The protective layer, in one embodiment, includes an optically transparent material, such as but not limited to SiN or nBLOK. Other suitable material which is optically transparent and may be selectively etched to the underlying second upper dielectric layer may be employed as the protective layer. The thickness of the protective layer is, for example, about 200 Å. Other suitable thickness dimension for the protective layer may also be useful, as long as it is sufficient to protect the underlying via plug from oxidation during formation of an alignment trench later and sufficiently thin to be completely removed thereafter without damaging the underlying second dielectric layer. The protective layer, for example, is formed by CVD. Other suitable forming techniques may also be employed.

A soft mask layer (not shown) is formed on the protective layer. The soft mask layer, in one embodiment, is a photoresist layer. The soft mask is patterned to form an opening corresponding to an alignment trench 155. Technique for forming the alignment trench is similar to that described FIG. 5d except that different etch chemistry may be used, depending on the material of the protective layer. The alignment trench, in one embodiment, is formed in the scribe lane. In other embodiments, the alignment reach may be formed in the device region. As described, the protective layer 662 includes an optically transparent material to enable the via plug to be optically visible such that the reticle having the alignment trench pattern can be aligned to the underlying via plug so that the alignment trench is formed near to the via plug. The alignment trench 155, as shown, extends from a top surface of the protective layer 662 to a portion of the second upper dielectric layer 150. The alignment trench may include any suitable depth and width dimensions as long as it is sufficiently deep to create adequate topography for subsequent alignment of the MTJ stack and subsequent layer of the MRAM cell.

Figure 6D:
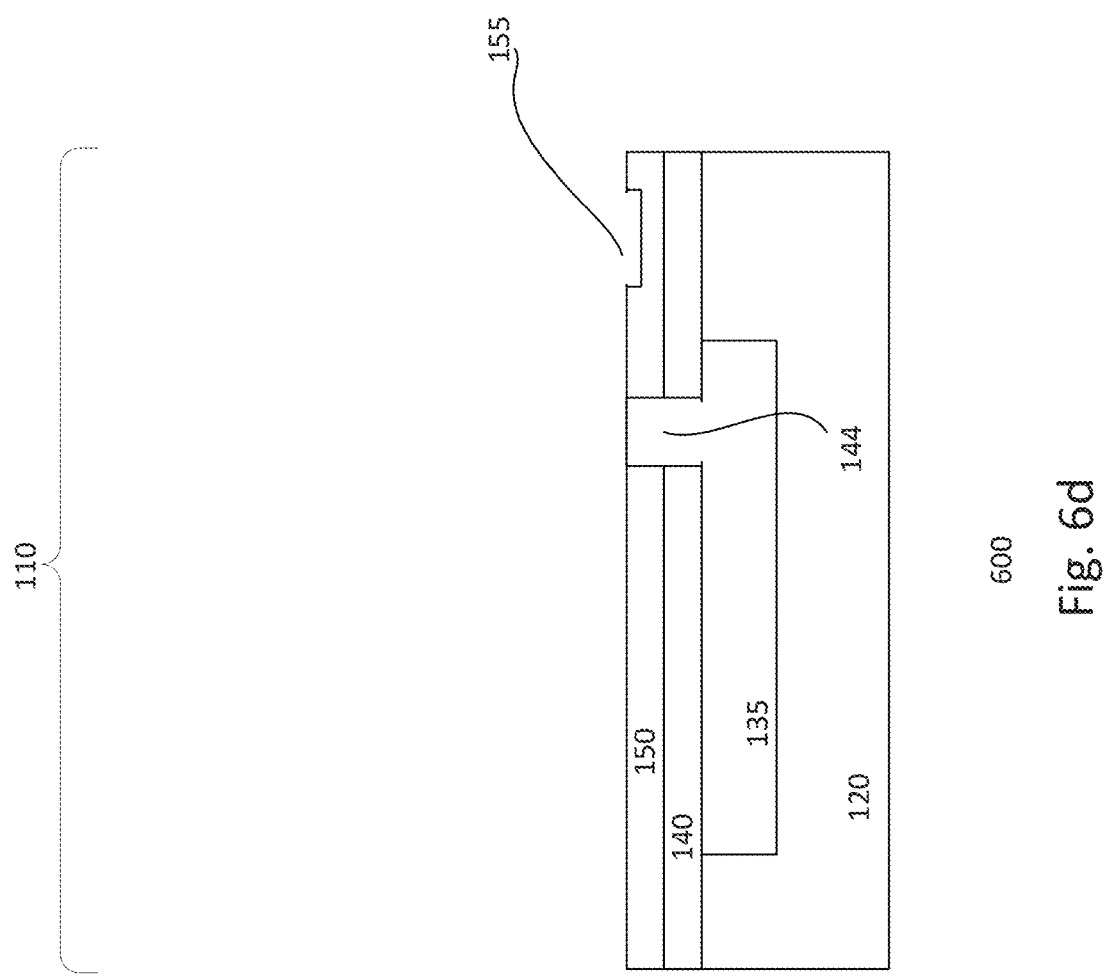

In one embodiment, the process continues by removing the protective layer 662 as shown in FIG. 6d. The protective layer, for example, is removed after forming the alignment trench. The protective layer is removed by an etch process which is performed in-situ after formation of the alignment trench. Other suitable removal techniques may also be useful, depending on the material of the protective layer and as long as the removal process does not affect the quality of the via plug and the second upper dielectric layer. Removal of the protective layer exposes a top surface of the second upper dielectric layer 150 and the via plug 140.

Figure 6E:
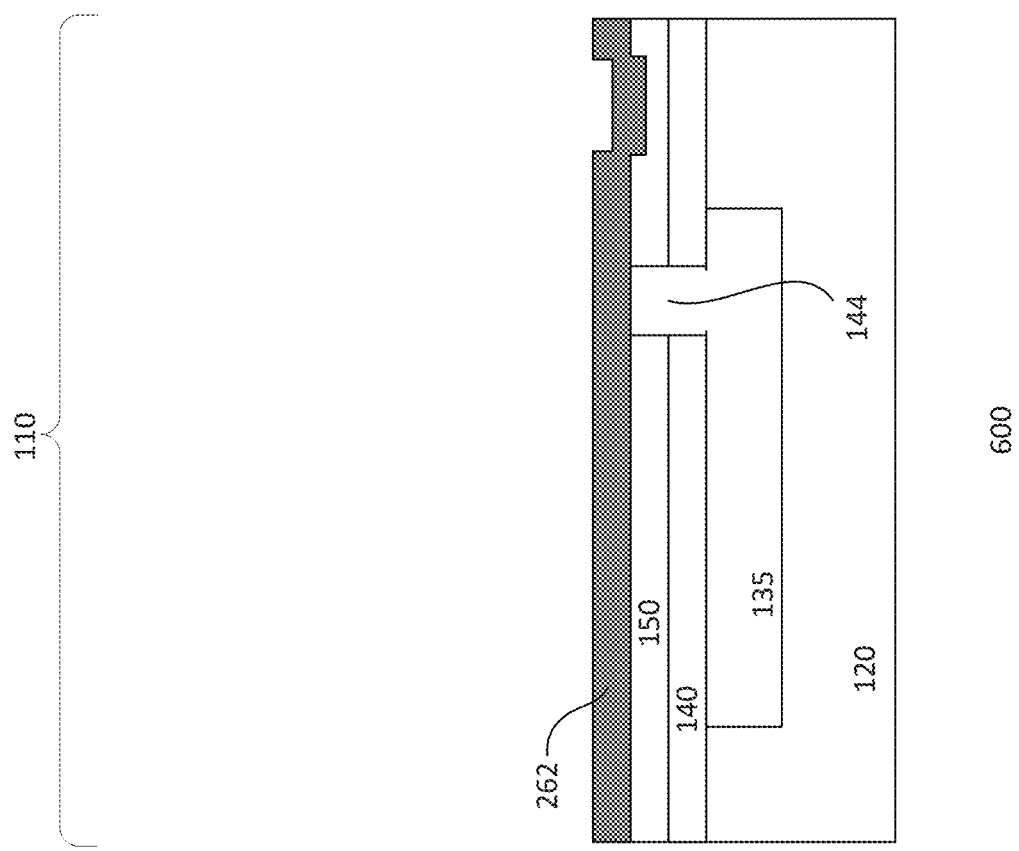

The process continues to form a MRAM cell. For example, various layers of memory element of the MRAM cell are sequentially formed over the second upper dielectric layer 150. In one embodiment, a bottom electrode layer 262 is conformally deposited over the second upper dielectric layer as shown in FIG. 6e. Material and technique for forming the bottom electrode layer are the same as that described in FIG. 5e. The bottom electrode layer is provided with a desired thickness having good roughness to serve as the bottom electrode of the MRAM cell later. The bottom electrode layer, in one embodiment, lines the top surface of the second upper dielectric layer 150 as well as sidewalk and bottom of the alignment trench 155. As shown, the bottom electrode layer tracks the profile of the underlying layer.

The process 600 continues to form various layer of the MTJ stack and other subsequent layers for the MRAM cell. For example, the process continues as similarly described in FIG. 5f and onwards. As such, these process steps will not be described or described in detail. The process continues until a device similar to that shown in FIGS. 4a-4b is formed.

As described, the device includes one memory cell. However, it is understood that the device may include numerous memory cells formed in the same IC.

The embodiments as described in FIGS. 4a-4b, FIGS. 5a-5h and FIGS. 6a-6e result in advantages. As described, it is important to ensure that the MTJ is aligned and electrically connected to the underlying via plug such that the device may function properly. The process 500 or 600 as illustrated forms an alignment trench which is used to align subsequently formed layers of layers of the MRAM cell with previously formed layers. The technique as described in this disclosure allows the profile of the alignment trench to be transferred to surfaces of the subsequently formed MTJ layers and layers of the MRAM cell to form an adequate topography feature. Although the MTJ layers are opaque, the presence of the topography feature which is visible from the top surface of the wafer serves as an alignment mark for patterning the MTJ layers to ensure that the patterned MTJ stack is aligned and coupled to the underlying via plug. Furthermore, a protective layer is used to cover the underlying via plug and serve as a hard mask during formation of the alignment trench. The protective layer thus protects the via plug from oxidation. Therefore, the processes as described do not compromise the quality of the via plug. In one embodiment, the protective layer includes the same material as the bottom electrode layer and forms part of the bottom electrode of the MRAM cell. In such case, a removal process to remove the protective layer thereafter is not required and further reduces manufacturing costs. The embodiments as described are also highly compatible with logic processing. This avoids the investment of new tools providing a cost effective solution.

The present disclosure may be embodied in other specific forms without departing from the spirit or essential characteristics thereof. The foregoing embodiments, therefore, are to be considered in all respects illustrative rather than limiting the invention described herein. Scope of the invention is thus indicated by the appended claims, rather than by the foregoing description, and all changes that come within the meaning and range of equivalency of the claims are intended to be embraced therein.

What is claimed is:

1. A method of forming a device comprising:
 providing a substrate defined with a memory cell region;
 providing a first upper dielectric layer over the substrate, wherein the first upper dielectric layer comprises a first upper interconnect level with one or more metal lines in the memory cell region;
 providing a second upper dielectric layer over the first upper dielectric layer, wherein the second upper dielectric layer comprises a via plug coupled to the metal line of the first upper interconnect level;
 providing a protective layer over the second upper dielectric layer and covers the via plug;
 forming an alignment trench which extends from a top surface of the protective layer to a portion of the second upper dielectric layer;
 forming various layers of a magnetic tunnel junction (MTJ) stack over the second upper dielectric layer, wherein profile of the alignment trench is transferred to surfaces of the various layers of the MTJ stack to form a topography feature which serves as an alignment mark; and
 patterning the various layers of the MTJ stack to define at least one MTJ element using the topography feature which serves as the alignment mark visible in top surface of the various layers of the MTJ stack to align the patterned MTJ element to the underlying via plug and to ensure that the patterned MTJ element is coupled to and in direct contact with the underlying via plug.

2. The method of claim 1 comprising:
 forming a bottom electrode layer over the protective layer, wherein the bottom electrode layer lines top surface of the protective layer as well as sidewalls and bottom of the alignment trench.

3. The method of claim 2 wherein the bottom electrode and the protective layer comprise the same material.

4. The method of claim 3 wherein the bottom electrode and the protective layers comprise Ti, TiN, Ta and TaN.

5. The method of claim 2 comprising forming a top electrode layer over the various layers of the MTJ stack, wherein the top electrode layer tracks profile of the underlying various layers of the MTJ stack.

6. The method of claim 5 wherein patterning the various layers of the MTJ stack comprises:
 providing a mask over the top electrode layer; and
 performing an etch process to remove exposed portions of the top and bottom electrode layers and various layers of the MTJ stack not protected by the mask, wherein the etched bottom electrode comprises a length greater than a length of the etched top electrode.

7. The method of claim 1 wherein the alignment trench is formed in scribe lane of the device.

8. The method of claim 1 wherein the alignment trench is formed in device region of the device.

9. The method of claim 1 wherein the protective layer comprises an optically transparent material.

10. The method of claim 9 wherein the protective layer comprises SiN or nBLOK.

11. The method of claim 1 comprising removing the protective layer after forming the alignment trench.

12. The method of claim 11 comprising forming a bottom electrode layer over the second upper dielectric layer, wherein the bottom electrode layer lines a top surface of the second upper dielectric layer as well as sidewalls and bottom of the alignment trench.

13. The method of claim 12 comprising forming a top electrode layer over the various layers of the MTJ stack, wherein the top electrode layer tracks profile of the underlying various layers of the MTJ stack.

14. The method of claim 13 wherein patterning the various layers of the MTJ stack comprises:
providing a mask over the top electrode layer; and
performing an etch process to remove exposed portions of the top and bottom electrode layers and various layers of the MTJ stack not protected by the mask.

15. The method of claim 14 wherein the etched bottom electrode comprises a length greater than a length of the etched top electrode.

16. The method of claim 11 wherein the alignment trench is formed in scribe lane of the device.

17. The method of claim 1 comprising:
forming a dielectric liner over the first upper dielectric layer and covers the metal line, wherein the via plug extends from a top surface of the second upper dielectric layer to the dielectric liner.

18. A method of forming a device comprising:
providing a substrate defined with a memory cell region;
providing a first upper dielectric layer over the substrate, wherein the first upper dielectric layer comprises a first upper interconnect level with one or more metal lines in the memory cell region;
providing a second upper dielectric layer over the first upper dielectric layer, wherein the second upper dielectric layer comprises a via plug coupled to the metal line of the first upper interconnect level;
providing a protective layer over the second upper dielectric layer and covers the via plug;
forming an alignment trench which extends from a top surface of the second upper dielectric layer to a portion of the second upper dielectric layer;
forming a bottom electrode layer over the protective layer, wherein the bottom electrode layer lines top surface of the protective layer as well as sidewalls and bottom of the alignment trench;
forming various layers of a magnetic tunnel junction (MTJ) stack over the second upper dielectric layer, wherein profile of the alignment trench is transferred to surfaces of the various layers of the MTJ stack to form a topography feature which serves as an alignment mark; and
patterning the various layers of the MTJ stack to form a MTJ element using the alignment mark visible in top surface of the various layers of the MTJ stack to align the MTJ element to the underlying via plug.

19. A wafer comprising:
a wafer substrate defined with at least a memory cell region;
a first upper dielectric layer disposed over the substrate, wherein the first upper dielectric layer comprises a first upper interconnect level with one or more metal lines in the memory cell region;
a second upper dielectric layer disposed over the first upper dielectric layer, wherein the second upper dielectric layer comprises a via plug coupled to the metal line of the first upper interconnect level;
an alignment trench disposed in the second upper dielectric layer, wherein the alignment trench extends from a top surface of the second upper dielectric layer to a portion of the second upper dielectric layer;
at least one magnetic tunnel junction (MTJ) stack disposed over the second upper dielectric layer, wherein the MTJ stack is aligned and coupled to and in direct contact with the underlying via plug based on the alignment trench.

20. The wafer of claim 19 wherein the alignment trench is disposed in scribe lane of the wafer.

* * * * *